United States Patent [19]

Peach

[11] Patent Number: 5,332,983

[45] Date of Patent: Jul. 26, 1994

[54] FILTERBANK USING SURFACE ACOUSTIC WAVE TECHNOLOGY

[75] Inventor: Robert C. Peach, Cambridge, Canada

[73] Assignee: Com Dev Ltd., Cambridge, Canada

[21] Appl. No.: 10,073

[22] Filed: Jan. 26, 1993

[30] Foreign Application Priority Data

May 25, 1992 [CA] Canada .............................. 2069369-0

[51] Int. Cl.$^5$ ............................................ H03H 9/64
[52] U.S. Cl. .................. 333/193; 333/196; 333/133
[58] Field of Search ............... 333/193, 194, 195, 196, 333/133; 310/313 R, 313 B, 313 C, 313 D

[56] References Cited

U.S. PATENT DOCUMENTS

| | | | |
|---|---|---|---|
| 3,942,140 | 3/1976 | Laker et al. | 333/193 |
| 4,321,567 | 3/1982 | Sandy | 333/196 |
| 4,734,664 | 3/1988 | Hikita et al. | 333/193 |
| 4,745,378 | 5/1988 | Niitsuma et al. | 333/196 |
| 4,803,449 | 2/1989 | Hikita et al. | 333/193 |

FOREIGN PATENT DOCUMENTS 0141024 8/1983 Japan ................................. 333/195

Primary Examiner—Benny Lee
Assistant Examiner—Darius Gambino
Attorney, Agent, or Firm—Daryl W. Schnurr

[57] ABSTRACT

A filterbank using surface acoustic wave technology and having a plurality of filters. Each filter has an input transducer and an output transducer. The input transducers are connected in parallel to a single matching circuit. The output transducers each have a separate matching circuit. The transducers are formed by a thin film of aluminum pattern on a piezoelectric substrate. The input transducers all have the same structure and the output transducers all have the same structure, though that structure is different from the input transducers. The only difference between the transducers of each filter is the location of electrode breaks for each electrode. A weighting function of the transducers is scaled and biased to provide a constant impedance across the bandwidth of the filterbank and to equalize the output amplitudes and capacitances of the output transducers. This produces a continuous level response across the bandwidth of the filterbank. Previously, while a continuous level response was theoretically achievable, it cannot be achieved in practice.

7 Claims, 7 Drawing Sheets

= NETWORKS FOR ADJUSTING PHASE AND AMPLITUDE

FILTERBANK USING SURFACE ACOUSTIC WAVE TECHNOLOGY

BACKGROUND OF THE INVENTION

1. Field of the Invention

This invention relates to contiguous filterbanks using surface acoustic wave (SAW) technology and, in particular, to filterbanks that produce an output signal with amplitude and phase characteristics to provide a continuous response across the entire bandwidth of the filterbank. These filterbanks can provide a range of bandwidth varying in discrete steps and are sometimes referred to as bandwidth switchable SAW filters (BSSF).

2. Description of the Prior Art

It is known to have filterbanks containing filters containing surface acoustic wave technology. Theoretically, a filterbank should produce an overall result that is the sum of the results of the individual filters. In most applications of filterbanks, it is desirable that the sum of these results should overlap sufficiently so that the combined response of the filters is continuous across the combined bandwidth. In practice, with known filterbanks, the theoretical response was not achievable and the combined response was not continuous across the combined bandwidth or the amplitude and phase characteristics of all filters do not track closely over the operating temperature range. The individual filters of the filterbank for BSSF filters often require a wide difference of bandwidths among the individual filters. The requirement for dissimilar bandwidths conflicts with that for identical tracking and theoretical responses have not been previously obtainable in practice. Further, with dissimilar bandwidths, substantial amplitude and phase offsets may occur over temperature.

SUMMARY OF THE INVENTION

A filterbank using surface acoustic wave technology has an input and an output. The filterbank has a plurality of filters, each filter having an input transducer and an output transducer. Each output transducer has a separate matching circuit, the matching circuits of all of the output transducers being identical to one another, said output transducers having identical impedances. Each transducer is formed by a film of metal pattern on a piezoelectric substrate and has electrodes extending between two busbars. The input transducers are interconnected. Each filter has a bandwidth that is dissimilar from the bandwidth of other filters in the filterbank. The bandwidth of the filters together providing an overall bandwidth for the filterbank. Each transducer has a weighting function, a radiation conductance, an output amplitude and a capacitance. The weighting function of each input transducer is scaled to equalize the radiation conductances and provide a constant impedance across the bandwidth of the filterbank. The weighting function of each output transducer is scaled to equalize the output amplitudes of all of the output transducers and biased to equalize the capacitances of the output transducers, thereby producing matched output signals with regard to amplitudes and phases with temperature and producing a continuous response across the bandwidth of the filterbank.

A method of operating a filterbank using surface acoustic wave technology where said filterbank has an input and an output and includes a plurality of filters, each filter having an input transducer and an output transducer, each output transducer having a separate matching circuit, the matching circuits of all of the output transducers being identical to one another, said output transducers having identical impedances, each transducer being formed by a thin film of metal pattern on a piezoelectric substrate and having electrodes, the input transducers being interconnected, each filter having a bandwidth that is dissimilar from the bandwidth of other filters in the filterbank, the bandwidth of the filters together providing an overall bandwidth for the filterbank, each transducer having a weighting function, a radiation conductance, an output amplitude and a capacitance, said method comprising scaling the weighting function of each input transducer to equalize the radiation conductances and provide a constant impedance across the bandwidth of the filterbank, scaling the weighting function of each output transducer to equalize the output amplitudes of all of the output transducers and biasing the weighting function of each of the output transducers to equalize the capacitances of the output transducers, thereby producing matched output signals with regard to amplitudes and phases with temperature and producing a continuous response across the bandwidth of the filterbank.

DESCRIPTION OF A PREFERRED EMBODIMENT

Figure 1A:
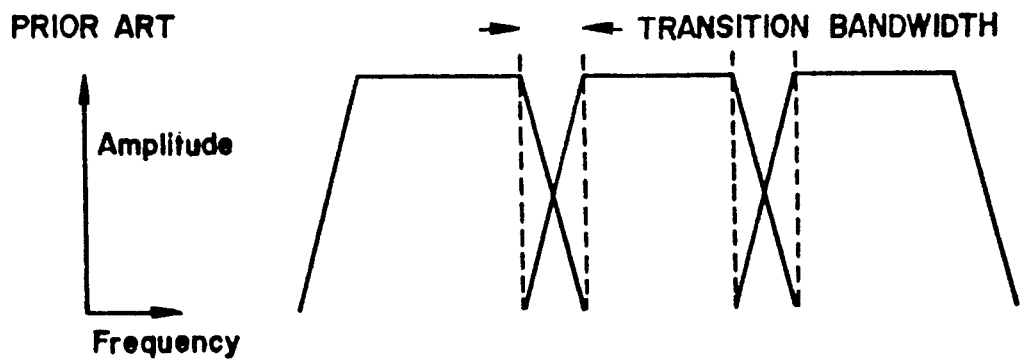
FIG. 1(a) is a prior art drawing showing the theoretical responses in a graph of amplitude versus frequency of three individual filters.
Figure 1B:
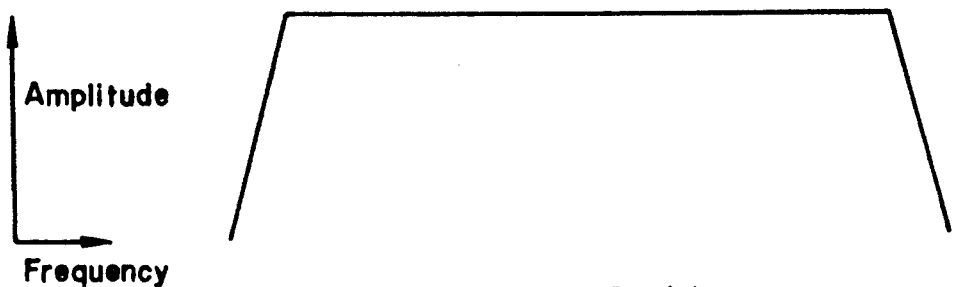
FIG. 1(b) is a prior art drawing of a theoretical composite filter response for a filterbank based on the combination of the individual filter responses of FIG. 1(a)
Figure 1C:
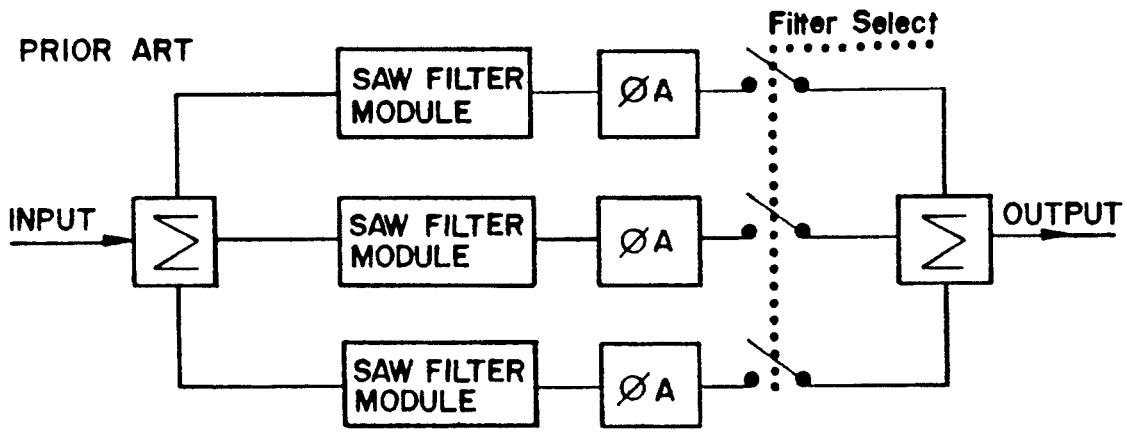
FIG. 1(c) is a prior art circuit diagram for a filterbank containing bandwidth switchable SAW filters.
Figure 1C:
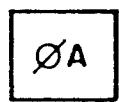

In FIGS. 1(a), 1(b) and 1(c), there is shown a schematic illustration of BSSF operation. The transition regions shown in FIG. 1(a), between passband and stopband edges, of adjacent filters overlap and the transition responses add vectorially to give a continuous overall response. The schematic illustration is theoretical only and the combined continuous response has not previously been achievable in practice. In practice, the transition responses did not add vectorially to produce the continuous response shown in FIG. 1(b) and the response in the transition regions was always an uneven response.

Figure 2:
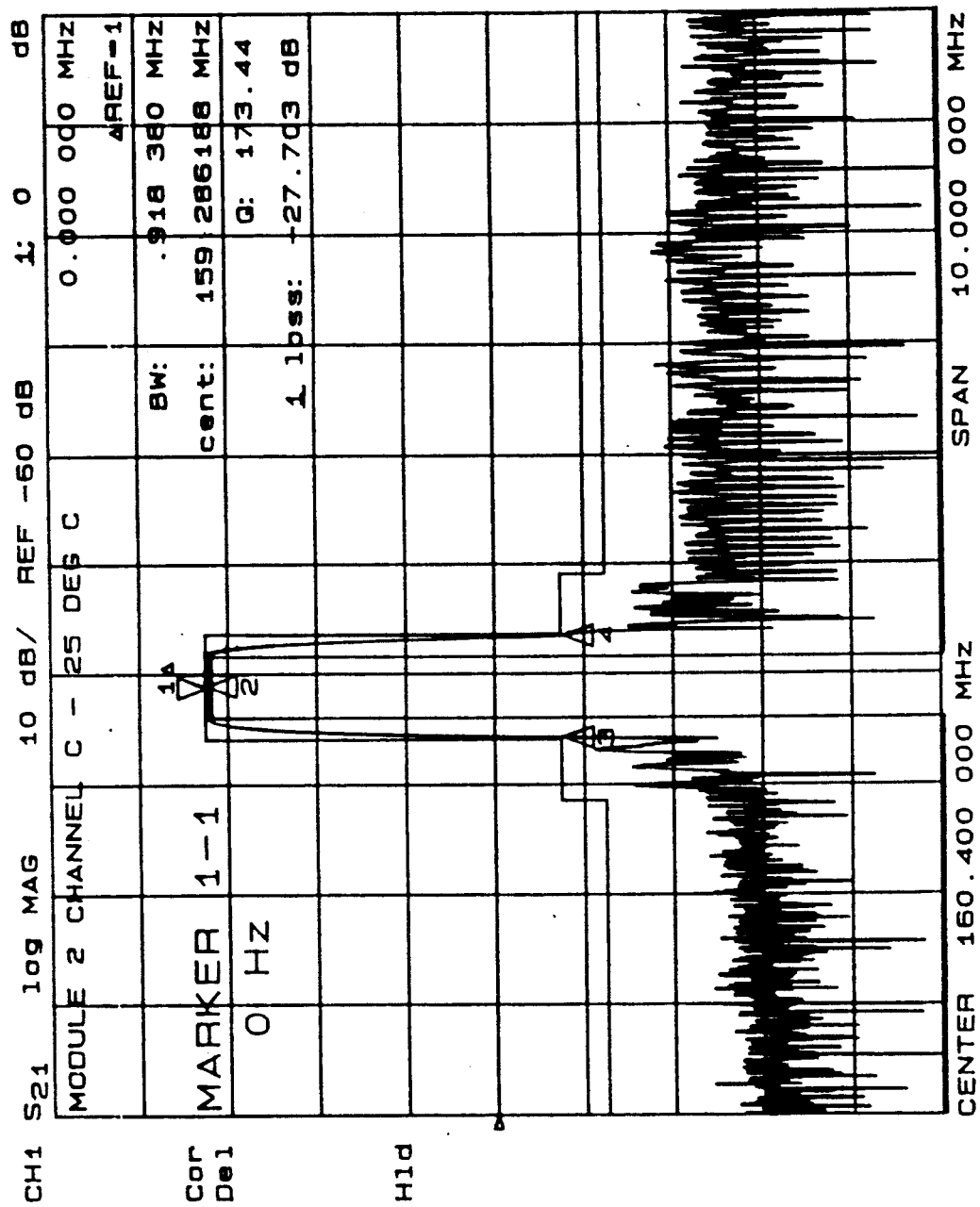
FIG. 2 is a graph of an individual filter response for a first SAW filter of a filterbank.
Figure 3:
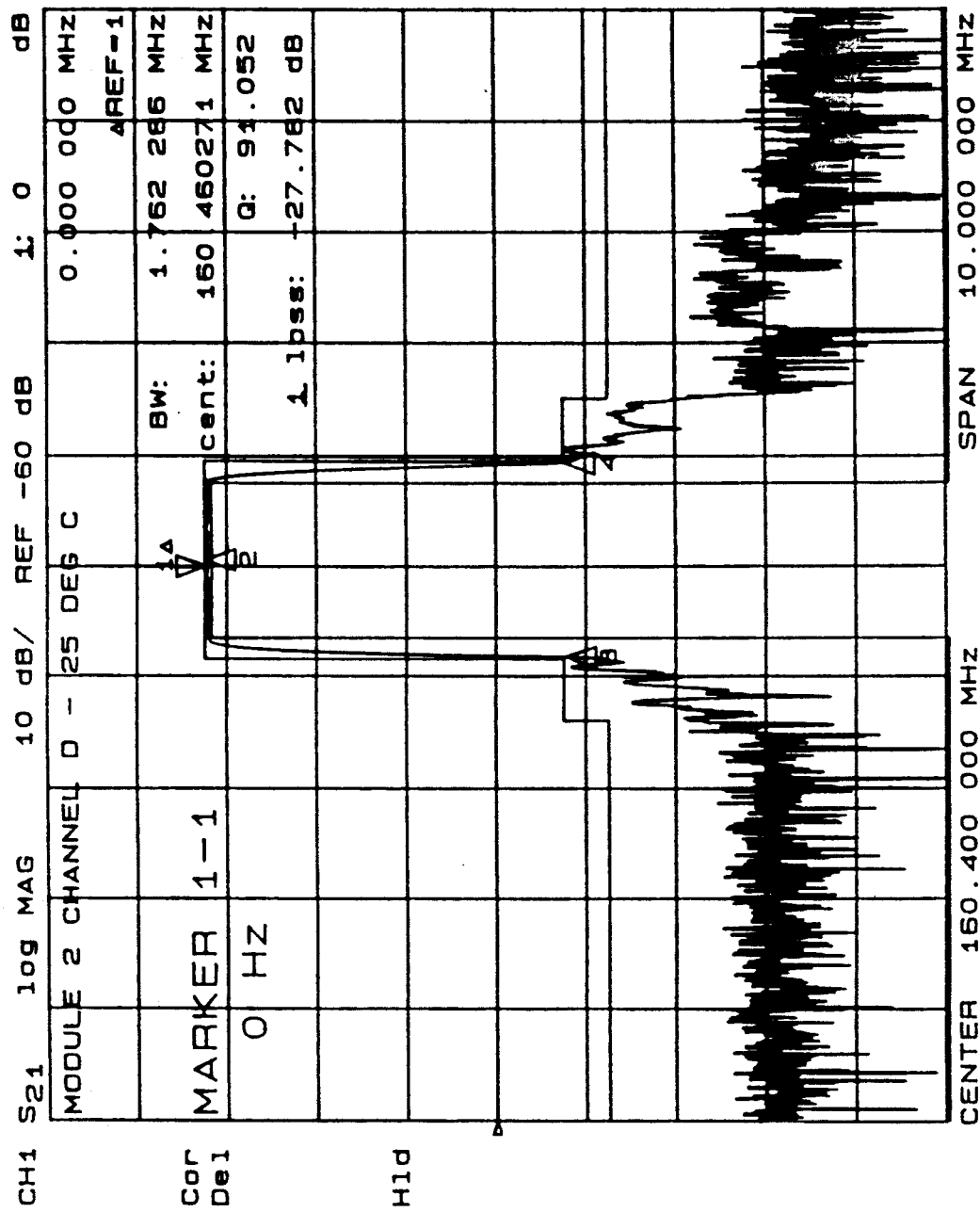
FIG. 3 is a graph of an individual filter response for a second SAW filter of a filterbank.
Figure 4:
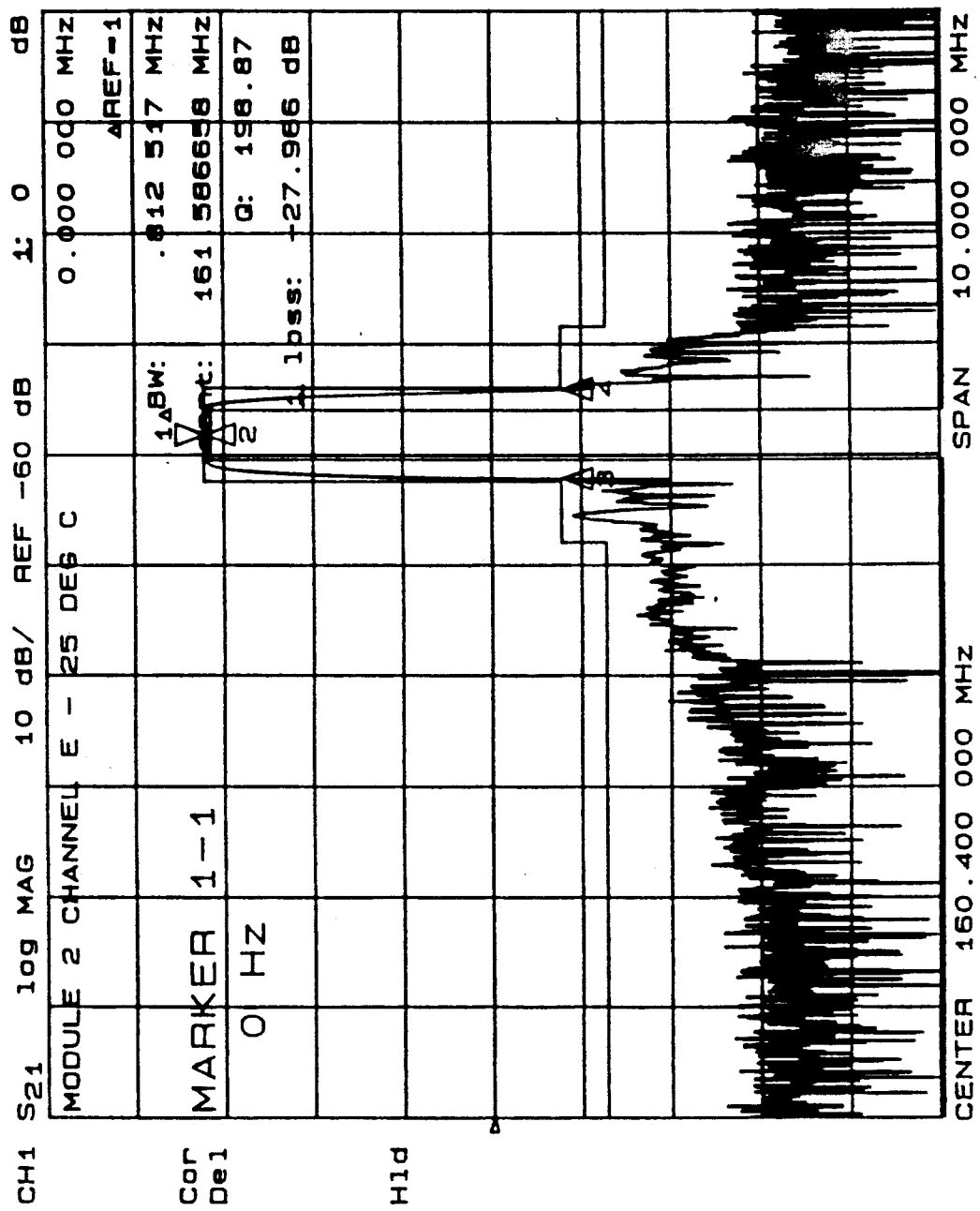
FIG. 4 is a graph of an individual filter response for a third SAW filter of a filterbank.
Figure 5:
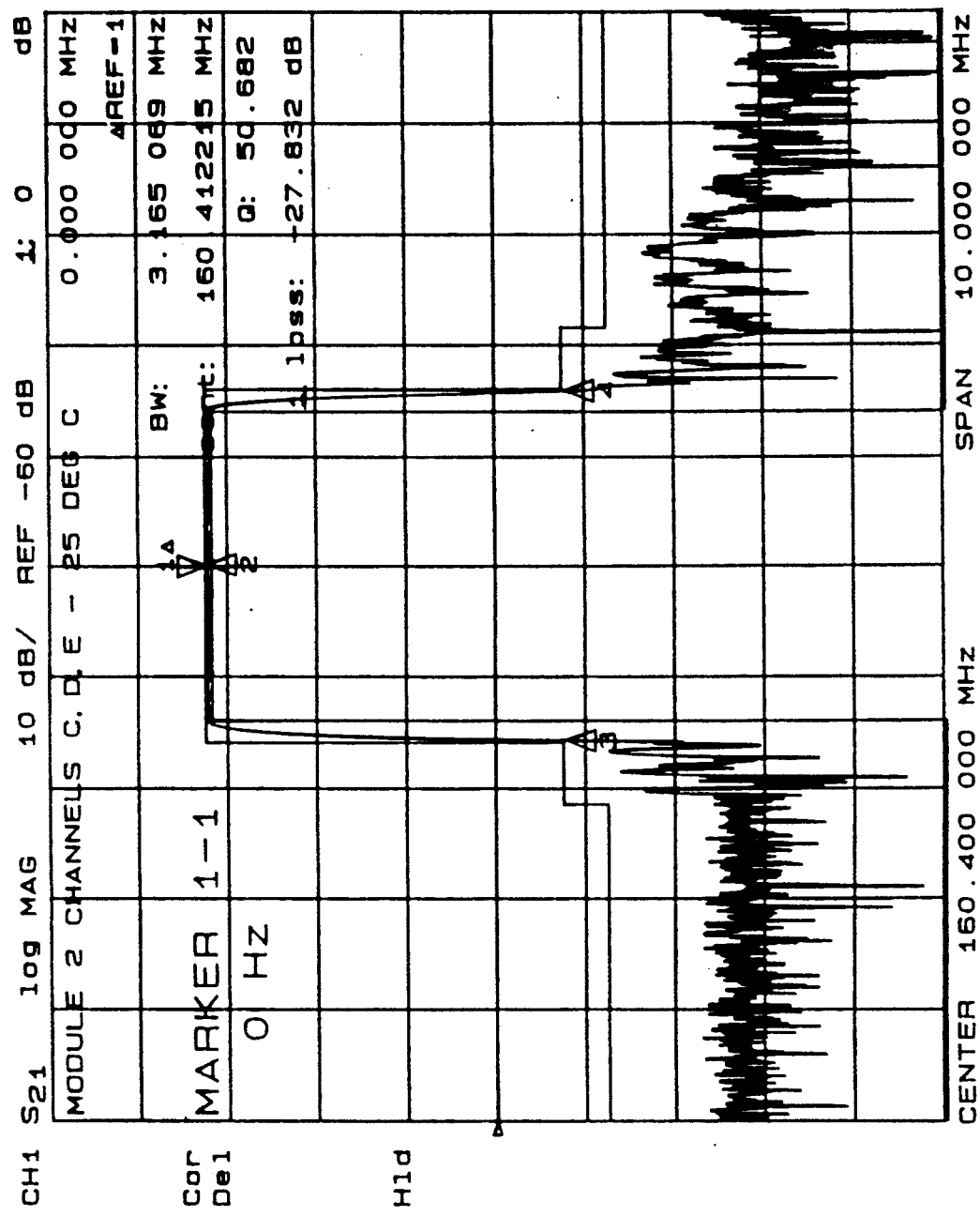
FIG. 5 is a graph showing the overall combined filterbank response of a filterbank containing the three filters shown in FIGS. 2, 3 and 4 in accordance with the present invention.

In a filterbank containing filters constructed and operated in accordance with the present invention, a continuous response can be attained over a wide temperature range. With appropriate software, the responses shown in FIGS. 2, 3 and 4 can be achieved. Each of the filters have dissimilar bandwidths and it can be seen from the combined response shown in FIG. 5 that the theoretical continuous response shown in FIG. 1(b) can be achieved on a practical basis in accordance with the present invention.

Figure 6:
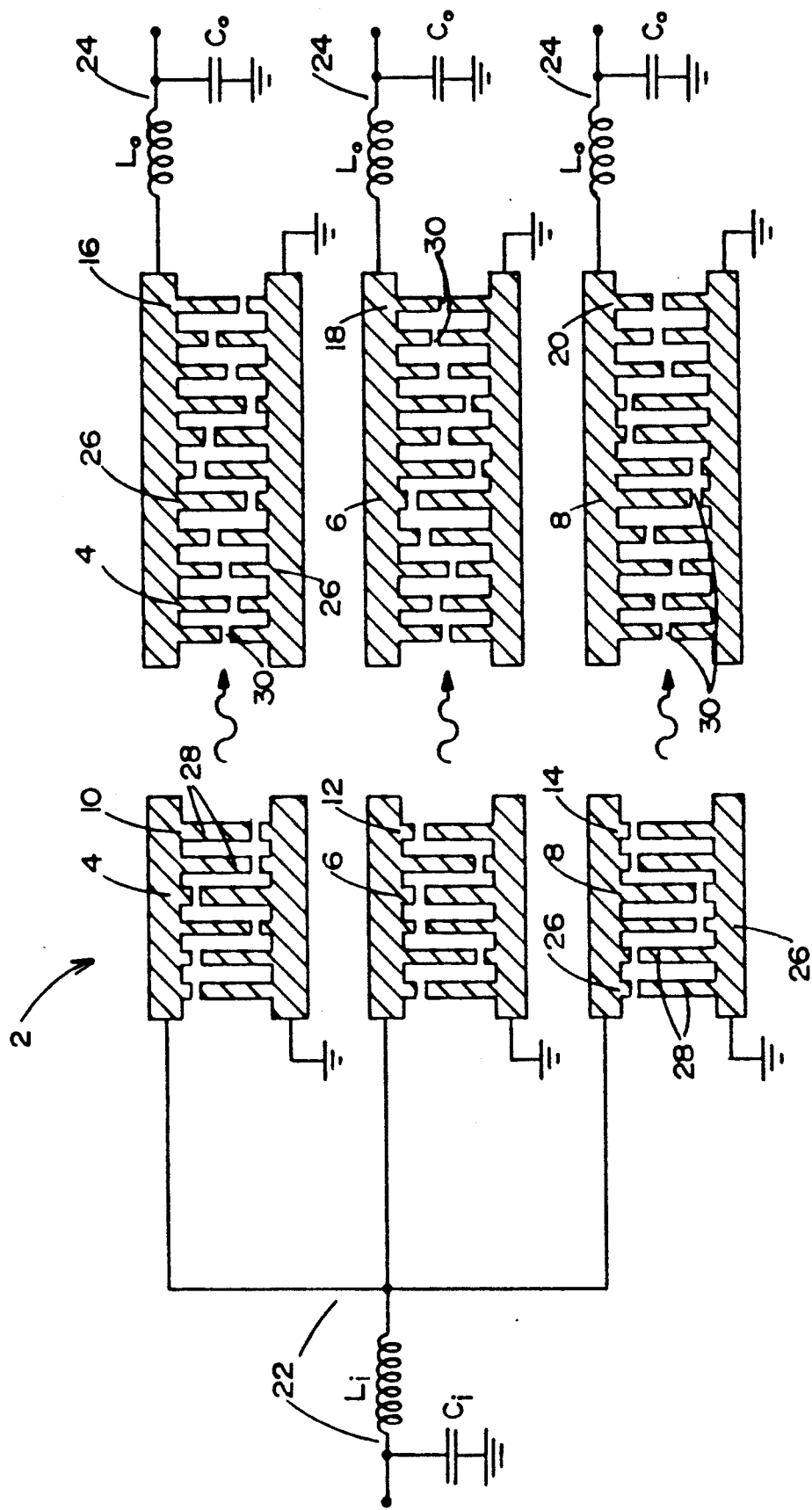
FIG. 6 is a schematic top view of a filterbank in accordance with the present invention, said filterbank having three filters containing transducers of identical structure.

In the schematic view shown in FIG. 6, a three channel BSSF filterbank 2 has three filters 4, 6, 8. Each of the filters 4, 6, 8 has three input transducers 10, 12, 14 and three output transducers 16, 18, 20 respectively. The three filters 4, 6, 8 have dissimilar bandwidths. The input transducers 10, 12, 14 are connected in parallel with a common input tuning circuit 22. It is possible to carry out the invention with the input transducers being interconnected in various other ways, including a series connection. The input tuning circuit 22 can also be referred to as an input matching circuit. Each output transducer 16, 18, 20 has a separate matching circuit 24 but all three matching circuits 24 are identical to one another. Each transducer has two busbars 26 connecting an array of parallel electrodes 28. Each electrode has a break 30 at some position between the busbars. The electrodes generate or detect the surface acoustic waves and the pattern of breaks controls the frequency response of the transducer.

The transducers of an actual filterbank may each contain thousands of electrodes. For ease of illustration, the transducers shown schematically in FIG. 6 have a relatively small number of electrodes. In the preferred embodiment of the present invention, the transducer structures for all filters in the filterbank are identical. In other words, each input transducer has a structure that is identical to a structure of all other input transducers in said filter and each output transducer has a structure that is identical to a structure of all output transducers in said filter, though the input and output transducers may have different structures. The input transducers have the same number of electrodes with the same widths and spacings and have the same spacing between the busbars. The only difference between the input transducers of the three filters shown in FIG. 6 is the position of the electrode breaks which follow a different pattern for each of the filters. Similarly, the output transducers all have the same number of electrodes with the same widths and spacings and the same spacing between the busbars. The only difference between the output transducers of the three filters is the pattern of electrode breaks. The pattern of breaks controls the frequency response and therefore the individual center frequency and bandwidth of each transducer. Therefore, a non-integral number of electrodes per wavelength is employed and the waveform is sampled non-synchronously. There is no detrimental effect on filter performance and the arrangement ensures that the properties of the filters are intrinsically matched.

Figure 7:
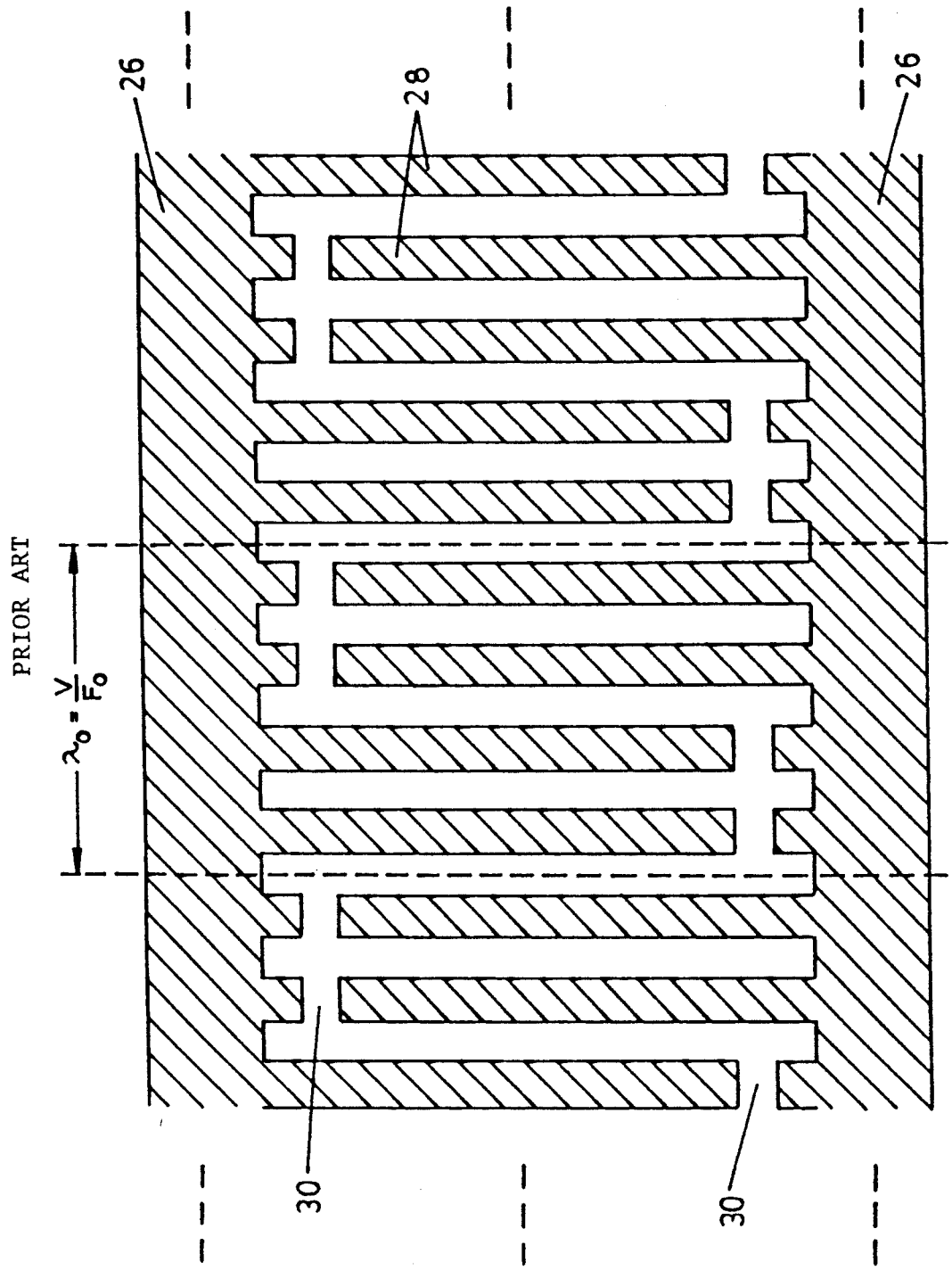
FIG. 7 is an enlarged view of part of a prior art SAW transducer structure having a split finger configuration.

The prior art "split finger" structure used in the vast majority of bandpass filter designs is shown in FIG. 7. The same reference numerals are used in FIG. 7 as those used in FIG. 6 for those components that are similar. The electrode period is an integral number of electrodes per wavelength at center frequency and for the split finger structure the electrode period is equal to a quarter of the SAW wavelength at center frequency $\lambda_0$. With this structure, the electrode period is fixed by the center frequency and varies among the filters within the filterbank. In the present invention, this relationship is broken and an essentially arbitrary electrode spacing is chosen, which spacing is preferably identical for all filters of the filterbank. While it is preferable that all of the input transducers have the same structure and all of the output transducers have the same structure, though it may be different from that of the output transducers, this is not essential and differences between the structures can be overcome by scaling the input transducers and scaling and biasing the output transducers to equalize the electrical properties of the filters and of the matching circuits.

The transducers are formed from thin film metal (for example, aluminum) patterns on a piezoelectric substrate, for example, quartz, lithium, niobate, lithium tantalate. Each transducer has a weighting function. The weighting function of the input transducers is scaled to equalize the radiation conductances and provide a constant impedance across the filter bandwidth. The weighting function of the input transducers can also be biased to equalize the capacitances, but the radiation conductance equalization leaves the capacitances quite closely matched and the residual difference in the capacitances is rarely significant. Therefore, biasing of the weighting function of the input transducers is not usually necessary. Thus, even though the filter bandwidths are quite dissimilar, the filters can be made to track over temperature and other conditions. The impedance of a SAW transducer varies significantly over temperature principally due to variation in ohmic resistance. When the input transducer impedances are equalized, identical matching conditions between transducers are preserved over temperature.

Since the output transducers have separate matching circuits, the output transducers must have identical impedances and must operate with identical matching circuits. Furthermore, the amplitudes and phases of the output signals must be precisely matched. The output amplitudes are equalized by scaling the weighting functions where necessary and the capacitances are equalized with bias weighting. By varying these two parameters, it is possible to provide matched output signals when operating with identical matching circuits. Further, since the input radiation conductances are equalized and the balancing of the output levels equalizes the transfer admittances, the output radiation conductances are also virtually identical. By use of scaling and biasing, it is therefore possible to ensure that all properties of the filters are equalized even when the filters have very dissimilar bandwidths. While the use of identical transducer structures for all of the filters is not essential, it is preferred as identical structures ensure that parasitic effects such as ohmic resistance are intrinsically matched.

The weighting function of a SAW interdigital transducer may be defined by a sequence of weights h(i), where i equals 1 . . . , N, where N is the number of electrodes in the transducer. The frequency response of the transducer is approximately equal to the Fourier transform of the weighting function. In the standard implementation, the weights are scaled so that a break position adjacent to one busbar corresponds to maximum h(i), while a break adjacent to the other busbar corresponds to minimum h(i). The electrode breaks are thus spread over the entire transducer aperture. However, the weights may be further scaled without affecting the frequency response. If the weights are all multiplied by an additional scaling factor of greater than 0 and less than 1, then the frequency response is unaffected, but the range of the electrode breaks is confined to a fraction of the aperture and the SAW signal level launched or received is scaled by a similar amount.

Even when the optimal weighting function for a transducer has been chosen, it is usually possible to add additional weighting functions without significantly affecting the frequency response. In the present case, this additional weighting, referred to as bias weighting or biasing, is used to equalize transducer capacitances. For example, the frequency response corresponding to a weighting function with normalized values of +1 and −1 on successive electrodes would produce a response at the stopband frequency of the transducer. This frequency is far removed from the filter passband and is at a point where SAW propagation is strongly suppressed. Therefore, the overall effect on the frequency response is negligible. The normal weighting function for a bandpass filter is approximately $\sin(x)/x$ function. The maximum electrode overlaps therefore occur over the center of the transducer and most of the capacitance is contributed by the center region. Given the large ohmic resistances in the patterns, it is desirable that any equalizing capacitance from the bias weights should be concentrated at the pattern center. This may be accomplished by modulating the alternating bias weights by, for example, a Gaussian envelope positioned at the pattern center.

In a typical use of the filterbank of the present invention, the filters will be narrow band high selectivity devices containing transducers placed directly in line. The input transducers will employ "withdrawal weighting" where all electrode breaks are constrained to be adjacent to one busbar or the other busbar. This form of weighting means that the weighting function is only approximated in a relatively crude manner but the withdrawal weighting approximation is applied to the scaled weighting functions in an identical manner to that previously described.

In the filterbank shown in FIG. 6, the net admittance presented to the input circuit consists of the combined capacitance and radiation conductances of the input transducers. The net radiation conductance is non-zero within the overall filterbank bandwidth but usually undergoes step changes in value in moving from one filter passband to the next. This is undesirable as the input admittance varies across the band and may produce amplitude tracking differences over temperature. The scaling of the weighting functions on the input transducers in accordance with the present invention is employed to equalize the radiation conductances. A constant admittance is therefore presented over the entire bandwidth of the filterbank and no tracking differences arise from the input tuning.

For series connected transducers, the transducer input impedance may be regarded as a capacitance in series with a radiation resistance. In this case, the weighting functions are adjusted to equalize the radiation resistances and maintain a constant impedance across the band. Whatever the mode of interconnection of the input transducers, whether series, parallel or a combination of the two, the weighting functions of the input transducers are always scaled to maintain a constant input impedance (admittance) across the entire band. In general, different component values are required for the various output matching circuits and this is not acceptable if tracking over temperature is to be maintained. To overcome this problem, the weighting function of each of the output transducers is scaled, and biased as necessary, to ensure that the output transducer capacitances are equal and that the transfer admittances are equalized between filters. This ensures that similar tuning component values are produced for all output circuits and eliminates any tracking differences from this source.

While the input and output matching circuits are single section LC circuits only, more or less complex matching circuits may be employed according to their requirements. These matching circuits are conventional and will be readily apparent to those skilled in the art. The filterbank shown in FIG. 6 shows three filters but, the present invention is not limited thereby and any reasonable number of filters can be used in a filterbank in accordance with the present invention. Further, the filters shown in FIG. 6 each have two transducers placed directly in line with one another. The present invention has been described as a de-multiplexer which splits a band of signals into sub-bands. The filterbank can be operated in reverse as a multiplexer. The outputs will then become inputs and the input becomes an output. The teachings of the present invention are equally applicable to other filter structures including, without limiting the generality of the foregoing, those filters that utilize multi-strip couplers.

What I claim as my invention is:

1. A filterbank using surface acoustic wave technology, said filterbank having an input and an output, said filterbank comprising a plurality of filters, each filter having an input transducer and an output transducer, each output transducer having a separate matching circuit, the matching circuits of all of the output transducers being identical to one another, said output transducers having identical impedances, each transducer being formed by a thin film of metal pattern on a piezoelectric substrate and having electrodes extending between two busbars, the input transducers being interconnected, each filter having a bandwidth that is dissimilar from the bandwidth of other filters in the filterbank, the bandwidth of the filters together providing an overall bandwidth for the filterbank, each transducer having a weighting function a radiation conductance, an output amplitude and a capacitance, the weighting function of each input transducer being scaled to equalize the radiation conductances and provide a constant impedance across the bandwidth of the filterbank, the weighting function of each output transducer being scaled to equalize the output amplitudes of all of the output transducers and biased to equalize the capacitances of the output transducers, thereby producing matched output signals with regard to amplitudes and phases with temperature and producing a continuous response across the bandwidth of the filterbank.

2. A filterbank as claimed in claim 1 wherein each input transducer has a structure that is identical to a structure of all other input transducers in said filter and each output transducer has a structure that is identical to a structure of all other output transducers in said filter, the input and output transducers having different structures, the input transducers having the same number of electrodes with the same widths and spacings and having the same spacing between the busbars with the electrode breaks within the input transducers for each of the filers being different from one another, the output transducers each having the same number of electrodes with the same widths and spacings and having the same spacing between the busbars, the pattern of electrode breaks within the output transducers being different from one another.

3. A filterbank as claimed in claim 2 wherein there are three filters.

4. A filterbank as claimed in any one of claims 1, 2 or 3 wherein the weighting function of each input transducer is biased to equalize the capacitances of the input transducers.

5. A filterbank as claimed in any one of claims 1, 2 or 3 wherein the input transducers are connected in parallel.

6. A filterbank using surface acoustic waveguide technology, said filterbank having an input and an output, said filterbank comprising a plurality of filters, each filter having an input transducer and an output transducer, each output transducer having a separate matching circuit, the matching circuits of all of the output transducers being identical to one another, each transducer being formed by a thin film of metal pattern on a piezoelectric substrate and having electrodes, the input transducers being interconnected, each filter having a bandwidth that is dissimilar from the other filters in the filterbank, the bandwidth of the filters together providing an overall bandwidth for the filterbank, each filter having electrical properties and a weighting function, scaling and biasing the weighting function to equalize the electrical properties of the filters and the matching circuits.

7. A method of operating a filterbank using surface acoustic wave technology where said filterbank has an input and an output and includes a plurality filters, each filter having an input transducer and an output transducer, each output transducer having a separate matching circuit, the matching circuits of all of the output transducers being identical to one another, said output transducers having identical impedances, each transducer being formed by a thin film of metal pattern on a piezoelectric substrate and having electrodes, the input transducers being interconnected, each filter having a bandwidth that is dissimilar from the other filters in the filterbank, the bandwidth of the filters together providing an overall bandwidth of the filterbank, each transducer having a weighting function, a radiation conductance, an output amplitude and a capacitance, said method comprising scaling the weighting function of each output transducer to equalize the radiation conductances and to provide a constant impedance across the bandwidth of the filterbank, scaling the weighting function of each output transducer to equalize the output amplitudes of all of the output transducers and biasing the weighting function of each of the output transducers to equalize the capacitances the output transducers to produce matched output signals with regard to amplitudes and phases with temperature and producing a continuous response across the bandwidth of the filterbank.

* * * * *